(12) United States Patent
Tang et al.

(10) Patent No.: US 7,589,995 B2
(45) Date of Patent: Sep. 15, 2009

(54) ONE-TRANSISTOR MEMORY CELL WITH BIAS GATE

(75) Inventors: Sanh D. Tang, Boise, ID (US); Gordon Haller, Boise, ID (US); Daniel H. Doyle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 181 days.

(21) Appl. No.: 11/516,814

(22) Filed: Sep. 7, 2006

(65) Prior Publication Data

US 2008/0061346 A1  Mar. 13, 2008

(51) Int. Cl.
G11C 11/34  (2006.01)
(52) U.S. Cl. ............... 365/174; 365/149; 257/E27.091
(58) Field of Classification Search .................. 365/174, 365/149; 257/E27.091
See application file for complete search history.

(56) References Cited

U.S. PATENT DOCUMENTS

| | | | |
|---|---|---|---|
| 5,358,879 A | 10/1994 | Brady et al. |
| 5,446,299 A | 8/1995 | Acovic et al. |
| 5,693,549 A | 12/1997 | Kim |
| 5,714,786 A | 2/1998 | Gonzalez et al. |
| 5,753,947 A | 5/1998 | Gonzalez |
| 6,005,273 A | 12/1999 | Gonzalez et al. |
| 6,090,693 A | 7/2000 | Gonzalez et al. |
| 6,096,596 A | 8/2000 | Gonzalez |
| 6,420,786 B1 | 7/2002 | Gonzalez et al. |
| 6,632,723 B2 | 10/2003 | Watanabe et al. |
| 6,818,937 B2 | 11/2004 | Noble et al. |
| 6,888,198 B1 | 5/2005 | Krivokapic |
| 6,888,770 B2 | 5/2005 | Ikehashi |
| 6,969,662 B2 | 11/2005 | Fazan et al. |
| 7,005,710 B1 | 2/2006 | Gonzalez et al. |
| 7,027,334 B2 | 4/2006 | Ikehashi et al. |
| 7,030,436 B2 | 4/2006 | Forbes |
| 2002/0130378 A1 | 9/2002 | Forbes et al. |
| 2002/0192911 A1 | 12/2002 | Parke |
| 2003/0094651 A1 | 5/2003 | Suh |
| 2004/0061148 A1 | 4/2004 | Hsu |

(Continued)

FOREIGN PATENT DOCUMENTS

WO  WO 2007/014689  2/2007

(Continued)

OTHER PUBLICATIONS

"Search Report", International Application No. PCT/US2007/019592, 6 pgs.

(Continued)

*Primary Examiner*—Huan Hoang
(74) *Attorney, Agent, or Firm*—Wells St. John P.S.

(57) ABSTRACT

One-transistor (1T) capacitor-less DRAM cells each include a MOS transistor having a bias gate layer that separates a floating body region from a base substrate. The MOS transistor functions as a storage device, eliminating the need of the storage capacitor. Logic "1" is written to and stored in the storage device by causing majority carriers (holes in an NMOS transistor) to accumulate and be held in the floating body region next to the bias gate layer, and is erased by removing the majority carriers from where they are held.

32 Claims, 15 Drawing Sheets

U.S. PATENT DOCUMENTS

| | | | |
|---|---|---|---|
| 2004/0197995 | A1 | 10/2004 | Lee et al. |
| 2005/0017240 | A1 | 1/2005 | Fazan |
| 2005/0063224 | A1 | 3/2005 | Fazan et al. |
| 2005/0124130 | A1 | 6/2005 | Mathew et al. |
| 2005/0167751 | A1 | 8/2005 | Nakajima et al. |
| 2006/0083058 | A1 | 4/2006 | Ohsawa |
| 2006/0194410 | A1 | 8/2006 | Sugaya |
| 2007/0001222 | A1 | 1/2007 | Orlowski et al. |
| 2007/0158719 | A1* | 7/2007 | Wang .................. 257/296 |
| 2008/0012056 | A1 | 1/2008 | Gonzalez |
| 2008/0061346 | A1 | 3/2008 | Tang et al. |

FOREIGN PATENT DOCUMENTS

| | | |
|---|---|---|
| WO | PCT/US2007/014689 | 6/2007 |
| WO | PCT/US2007/014689 | 4/2008 |
| WO | PCT/US2007/019592 | 3/2009 |

OTHER PUBLICATIONS

"Written Opinion", International Application No. PCT/US2007/019592, 7 pgs.

Ranica, R, et al., "A One Transistor Cell on Bulk Substrate (IT-Bulk) for Low-Cost & high Density eDRAM", *VLSI Technology*, 2004. *Digest of Technical Papers*. 2004, Piscataway, NJ, USA, *IEEE*, (Jun. 15, 2004), 128-129 pgs.

Villaret, A, et al., "Mechanisms of charge modulation in the floating body of triple-well nMOSFET capacitor-less DRAMs", vol. 72(1-4), Elsevier Publishers B.V.,(Apr. 2004),434-439 pgs.

Fazan, P. C., et al., "MOSFET design simplifies DRAM", *EE Times*, (May 13, 2002),7 pages.

Hara, Yoshiko, "Toshiba cuts capcitor from DRAM cell design", *EE Times*, http://www.us.design-reuse.com/news/news24.html,(Feb. 7, 2002),2 pages.

Minami, Y., et al., "A Floating Body Cell(FBC) Fully Compatible with 90nm CMOS Technology(CMOS4) for 128Mb SOI DRAM", *2005 IEDM Technical Program*, (2005), 13.1.1-13.1.4.

Tanaka, T., et al., "Scalability study on a capacitorless 1T-DRAM: from single-gate PD-SOI to double-gate FinDRAM", *IEDM Technical Digest. IEEE International Electron Devices Meeting*, (Dec. 13-15, 2004),37.5-1-37.5.4.

Yoshida, E., et al., "A design of a capacitorless 1T-DRAM cell using gate-induced drain leakage (GIDL) current for low-power and high-speed embedded memory", *IEEE International Electron Devices Meeting, 2003. IEDM '03 Technical Digest.*, (Dec. 8-10, 2003),37.6.1-37.6.4.

Chen et al., "The Enhancement of Gate-Induced-Drain-Leakage (GIDL) Current in Short-Channel SOI MOSFET and its Application in Measuring Lateral Bipolar Current Gain B," IEEE Electron Device Letters, vol. 13, No. 11, pp. 572-574 (Nov. 1992).

Choi et al., "Investigation of Gate-Induced Drain Leakage (GIDL) Current in Thin Body Devices: Single-Gate Ultrathin Body, Symmetrical Double-Gate, and Asymmetrical Double-Gate MOSFETs" Jpn. J. Appl. Phys., vol. 42, pp. 2073-2076 (2003).

Gonzalez et al., "A dynamic source-drain extension MOSFET using a separately biased conductive spacer", Solid-State Electronics, vol. 46, pp. 1525-1530 (2002).

Kuo et al., "A Capacitorless Double-Gate DRAM Cell Design for High Density Applications", IEEE, IEDM, pp. 843-846 (2002).

Lusky et al., "Investigation of Channel Hot Electron Injection by Localized Charge-Trapping Nonvolatile Memory Devices", IEEE Transactions on Electron Devices, vol. 51, No. 3, pp. 444-451 (Mar. 2004).

Minami et al., "A High Speed and High Reliability MOSFET Utilizing an Auxiliary Gate", 1990 Symposium on VLSI Technology, IEEE, pp. 41-42 (1990).

Sunouchi et al., "Double LDD Concave (DLC) Structure for Sub-Half Micron MOSFET", IEEE, IEDM, pp. 226-228 (1988).

Tiwari et al., "Straddle Gate Transistors: High Ion/Ioff Transistors at Short Gate Lengths", IBM Research Article, pp. 26-27 (pre-Mar. 2006).

Yoshida et al., "A Capacitorless 1T-DRAM Technology Using Gate-Induced Drain-Leakage (GIDL) Current for Low-Power and High-Speed Embedded Memory", IEEE Transactions on Electron Devices, vol. 53, No. 4, pp. 692-697 (Apr. 2006).

* cited by examiner

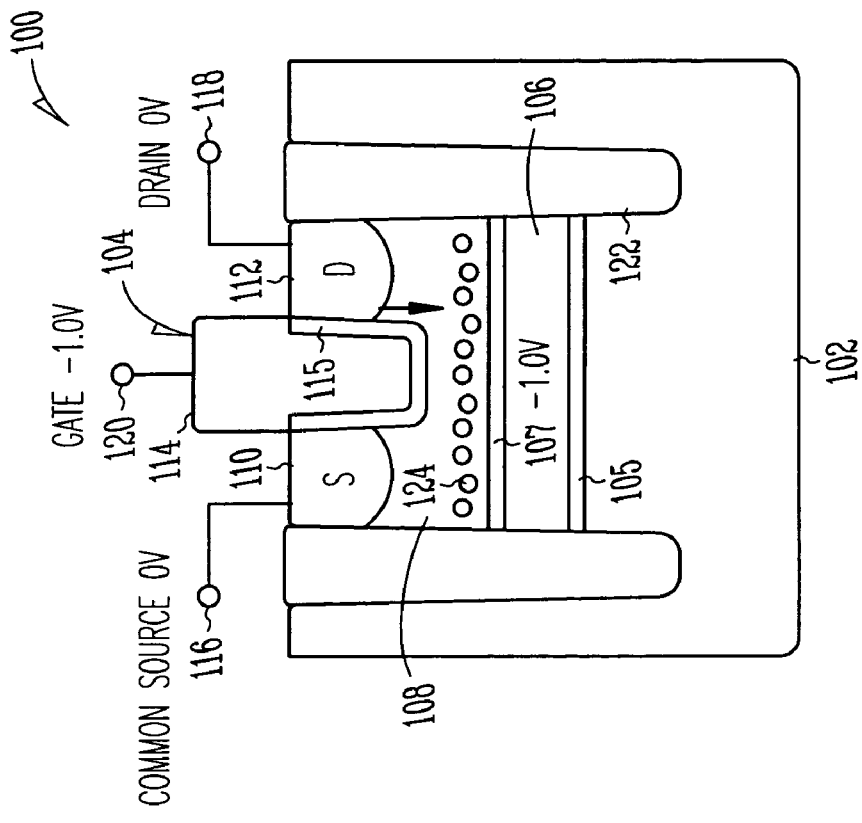
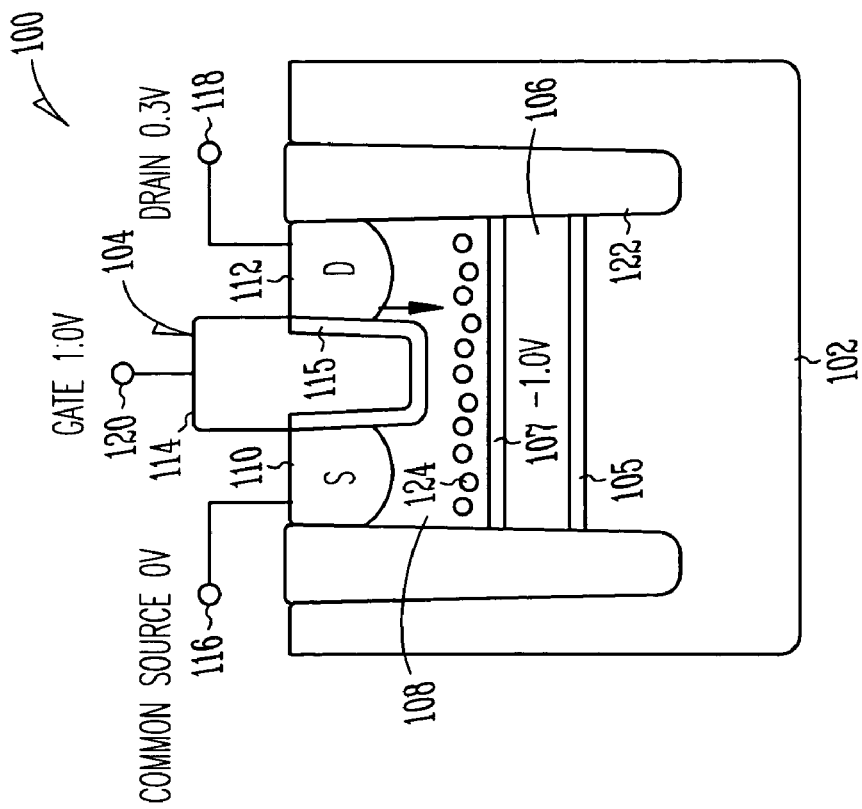

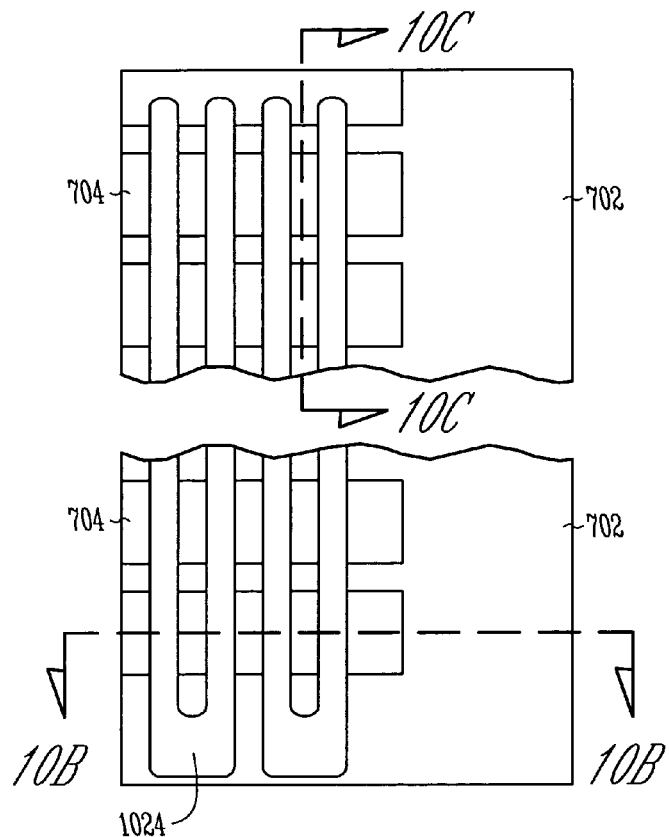
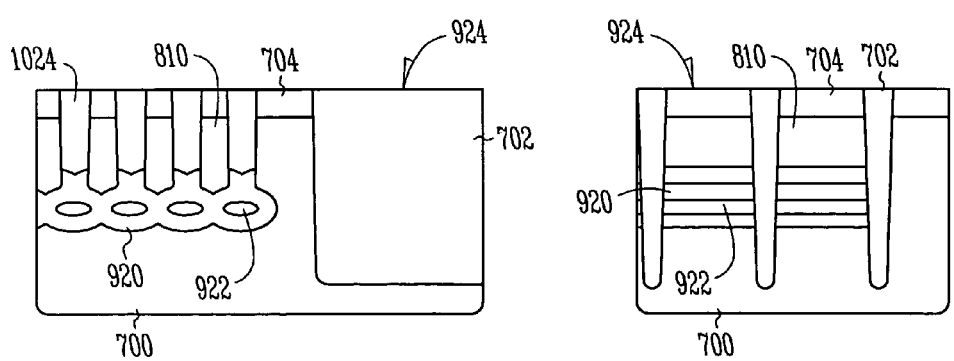
Fig. 10A
Fig. 10B
Fig. 10C

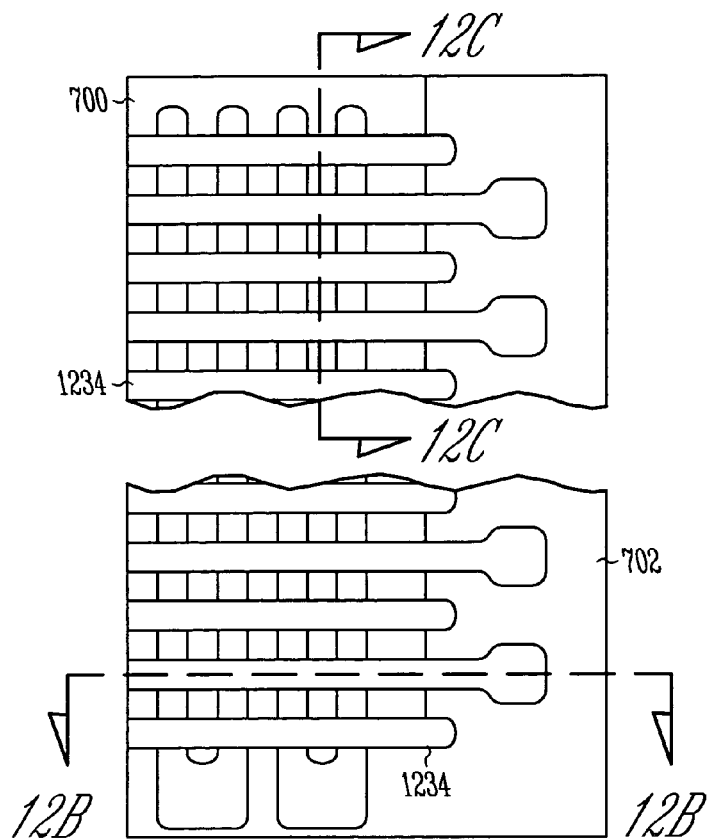
Fig. 12A
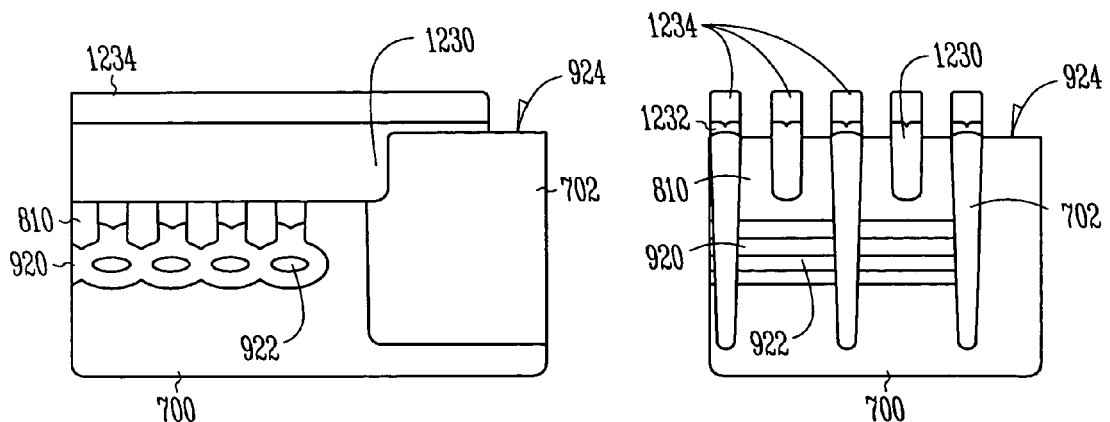
Fig. 12B
Fig. 12C

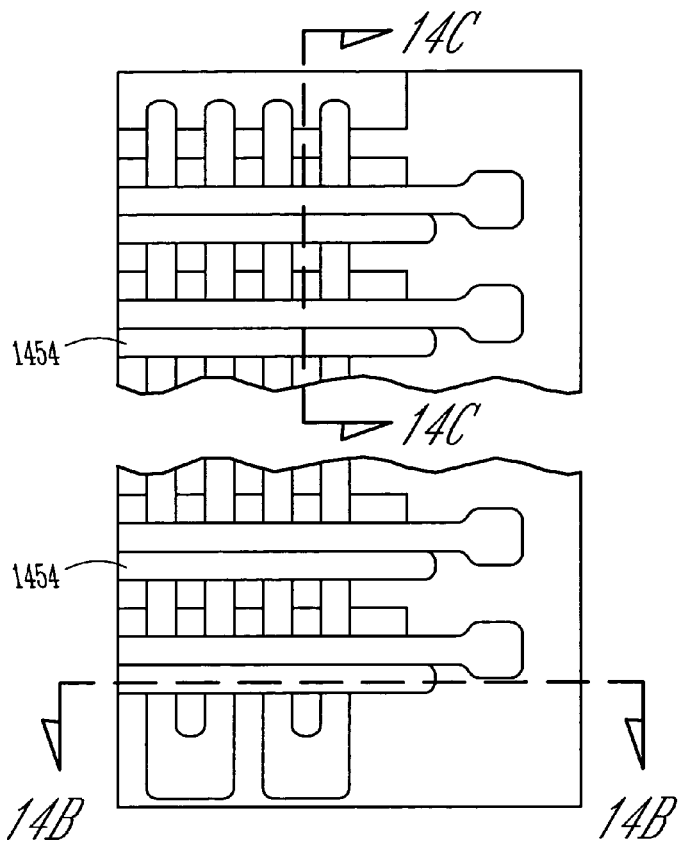
*Fig. 14A*
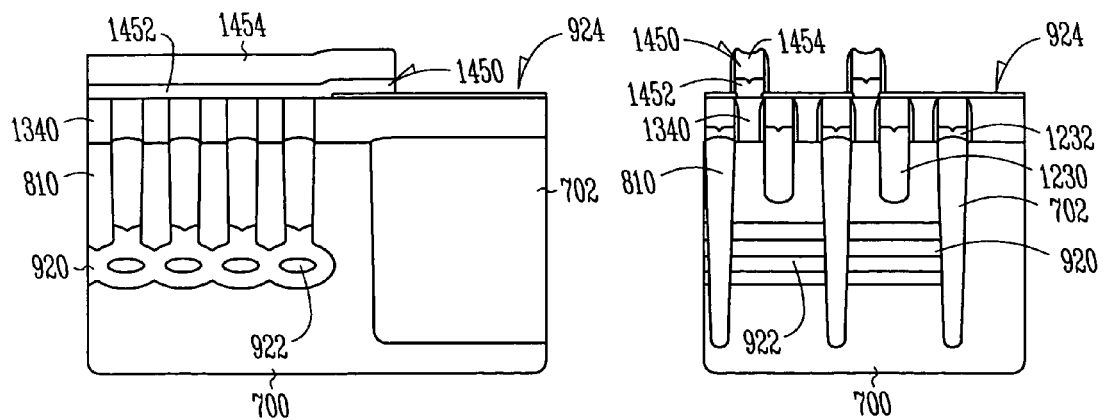
*Fig. 14B*  *Fig. 14C*

ONE-TRANSISTOR MEMORY CELL WITH BIAS GATE

TECHNICAL FIELD

This document relates generally to semiconductor integrated circuit technology and particularly, but not by way of limitation, to one-transistor (1T) capacitor-less memory device in which the transistor includes a bias gate separating a floating body from the base substrate of the device.

BACKGROUND

A known dynamic random access memory (DRAM) cell includes a transistor and a capacitor. The transistor functions as a switch controlling whether a data bit is being written into, read from, or held in the DRAM cell. The capacitor functions as the storage device. This one-transistor/one-capacitor (1T/1C) structure limits the extent to which the DRAM cell can be miniaturized and hence the memory capacity of the DRAM device given a certain physical size. The increasing need for smaller electronic systems and larger memory capacity (such as multi-gigabytes), among other reasons, requires reduction in size of the physical structures inside a memory device. While the minimum size of the transistor has been shrinking with the advance of the semiconductor fabrication technology, the size of the capacitor has become the bottleneck in miniaturization of the DRAM cell.

A capacitor-less DRAM cell technology has been provided by fabricating a metal-oxide semiconductor field-effect transistor (MOSFET) on a silicon-on-insulator (SOI) wafer. Because of the insulator between the MOSFET and the base substrate of the wafer, the body of the MOSFET is electrically floating. This effect is utilized to store data by storing a charge (holes in an n-channel MOSFET, or NMOS) in and drawing the charge out of the floating body, which performs the functions of the capacitor in the typical DRAM cell. Such a "floating body cell", or FBC, eliminates the need for the capacitor in a DRAM cell, thereby removing the capacitor as a bottleneck in the miniaturization of the DRAM cell. However, SOI devices are more costly to produce and therefore have been used primarily for high-end applications. Thus, to increase memory capacity without substantially increasing the size and the cost of DRAM devices, there is a need for reducing the size of a DRAM cell in a less expensive way.

BRIEF DESCRIPTION OF THE DRAWINGS

The drawings illustrate generally, by way of example, but not by way of limitation, various embodiments discussed in the present document.

FIGS. 1A-D are illustrations of an embodiment of a structure of portions of a DRAM device showing a MOS transistor having a floating body formed on a bias gate during various states of operation.

FIGS. 10A-C are illustrations of planarization in the embodiment of the fabrication process.

FIGS. 12A-C are illustrations of array recessed gate formation in the embodiment of the fabrication process.

FIGS. 14A-C are illustrations of common source interconnection formation in the embodiment of the fabrication process.

DETAILED DESCRIPTION

Figure 1A:
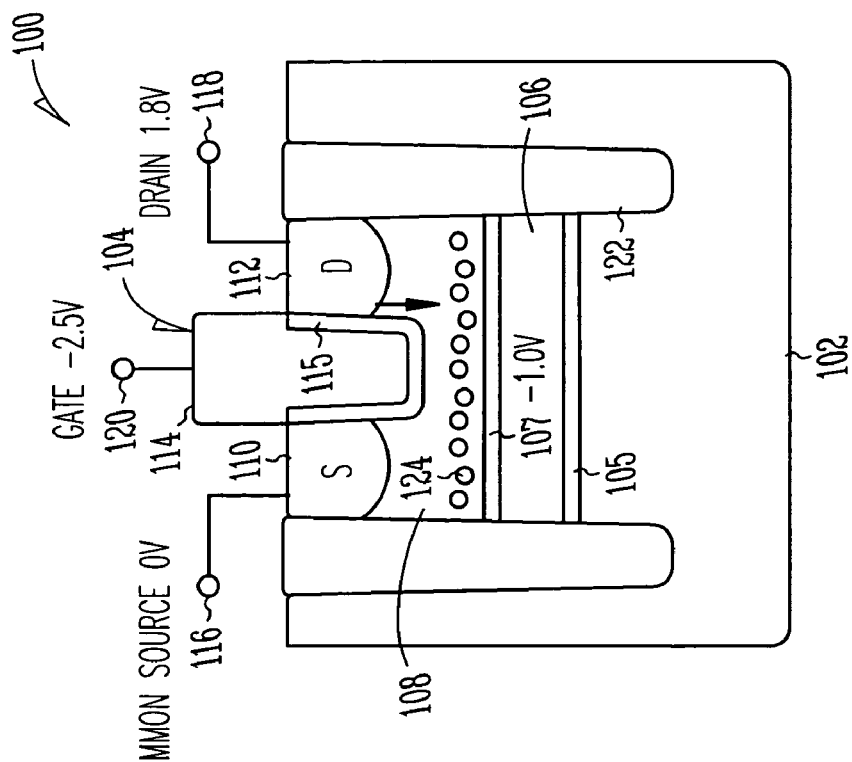

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. References to "an", "one", or "various" embodiments in this disclosure are not necessarily to the same embodiment, and such references contemplate more than one embodiment. The following detailed description provides examples, and the scope of the present invention is defined by the appended claims and their legal equivalents.

In this document, a "MOS transistor" or "MOSFET" refers to a metal-oxide semiconductor field-effect transistor, an "NMOS transistor" refers to an n-channel metal-oxide semiconductor field-effect transistor (or n-channel MOSFET), and a "PMOS" refers to a p-channel metal-oxide semiconductor field-effect transistor (or p-channel MOSFET).

In this document, "logic '1'" and "logic '0'" refer to binary digits represented by two different voltage levels in a digital circuit. "Logic '1'" is represented by the higher voltage of the two different voltage levels. "Logic '0'" is represented by the lower voltage of the two different voltage levels.

This document discusses one-transistor (1T) capacitor-less DRAM cells. "Capacitor-less" (also referred to as zero-capacitor or 0C) refers to the lack of a structure intentionally formed as a storage capacitor in a memory cell. Each 1T capacitor-less DRAM cell includes a MOS transistor having a bias gate layer that separates a floating body region from a base substrate. The MOS transistor functions as a storage device, eliminating the need of the storage capacitor. Logic "1" is written to and stored in the storage device by causing majority carriers (holes in an NMOS transistor) to accumulate and be held in the floating body next to the bias gate layer. Logic "1" is erased (i.e., logic "0" is written) by removing the majority carriers from where they are held.

FIGS. 1A-D are illustrations of an embodiment of a structure of portions of a DRAM device 100 showing a MOS transistor 104 during various states of operation. DRAM device 100 includes 1T capacitor-less memory cells each formed with one MOS transistor 104. MOS transistor 104 is formed on a base substrate 102 made of single crystalline silicon. A conductive bias gate layer 106 is formed on a gate dielectric 105 over base substrate 102. The bias gate layer 106 is made of in situ doped (ISD) polysilicon. A floating body region 108 is formed on a gate dielectric 107 over bias gate layer 106 and coupled between a source region 110 and a drain region 112. Source region 110 separates a source terminal 116 from floating body region 108. Drain region 112 separates a drain terminal 118 from floating body region 108. A gate 114 is formed on floating body region 108 between source region 110 and drain region 112 and is separated from source region 110, drain region 112, and floating body region 108 by a gate dielectric 115. Gate 114 is coupled between a gate terminal 120 from gate dielectric 115. An oxide 122 forms an isolation surrounding MOS transistor 104.

In one embodiment, bias gate layer 106 is formed after the formation of floating body region 108. Bias gate layer 106 is self-aligned to floating body region 108 as the conductive polysilicon is deposited onto base substrate 102 between the formed floating body regions 108. In one embodiment, base substrate 102 and floating body region 108 are formed by a single crystalline silicon, and gate dielectrics 105, 107, and 115 include the same oxide formed at the same time during the fabrication process. An example of a process for fabricating MOS transistor 104 is discussed below, with reference to FIGS. 7-15. In FIGS, 2-3 and 9-15, a gate dielectric exists between the gate and the source, drain, and floating body, between the bias gate and the floating body, and between the bias gate and the base substrate (though not explicitly shown or labeled).

During operation, source terminal 116 is coupled to a ground potential (0 V). Bias gate layer 106 is coupled to a negative potential. In one embodiment, bias gate layer 106 is coupled to a negative potential between approximately −0.25 V to −2.0 V. In a specific embodiment, bias gate layer 106 is coupled to a negative potential of approximately −1.0 V.

FIG. 1A illustrates an embodiment of the operation for writing logic "1". To write logic "1", gate terminal 120 is coupled to a negative gate potential for writing, and drain terminal 118 is coupled to a positive drain potential for writing. In one embodiment, the negative gate potential and positive drain potential create a gate-induced drain leakage (GIDL) current. Majority carriers (holes) 124 are attracted to the negative potential of bias gate layer 106, such that logic "1" is written into MOS transistor 104. In one embodiment, the negative gate potential for writing is between approximately −1.5 V to −3.0 V, and the positive drain potential for writing is between approximately 0.8 V to 2.0 V. In a specific embodiment, the negative gate potential for writing is approximately −2.5 V, and the positive drain potential for writing is approximately 1.8 V. The GIDL current is created by the high gate-to-drain voltage ($V_{GD}$=4.3 V).

In another embodiment, to write logic "1", gate terminal 120 is coupled to a positive gate potential for writing, and drain terminal 118 is coupled to a positive drain potential for writing. A lower positive gate potential and a higher positive drain potential creates impact ionization. MOS transistor 104 operates in the current saturation region, causing a current to flow while allowing impact ionization to occur near drain region 112. The impact ionization produces holes, which are attracted to the negative potential of bias gate layer 106. In one embodiment, the positive gate potential for writing is between approximately 0.7 V to 1.5 V, and the positive drain potential for writing is between approximately 1.0 V to 2.5 V. In a specific embodiment, the positive gate potential for writing is approximately 1.0 V, and the positive drain potential for writing is approximately 1.5 V.

Figure 1B:
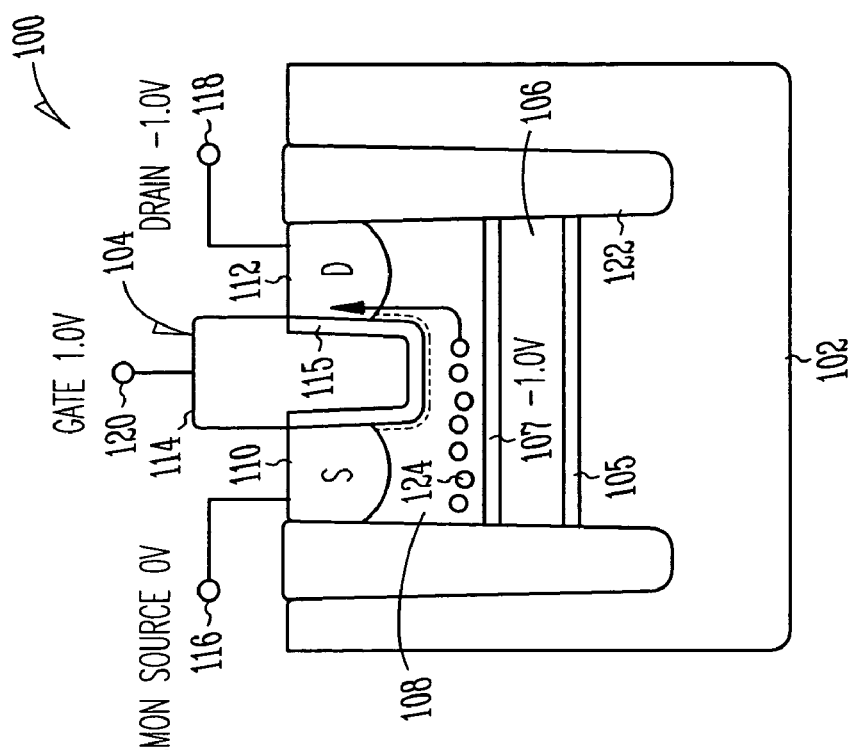

FIG. 1B illustrates an embodiment of the operation for writing logic "0", i.e., erasing logic "1". In the embodiment of impact ionization, to write logic "0", gate terminal 120 is coupled to a positive gate potential for erasing, and drain terminal 118 is coupled to a negative drain potential for erasing. The inverted channel and the negative drain potential create a potential that removes holes 124 from the region of floating body region 108 near bias gate layer 106. In one embodiment, the positive gate potential for erasing is between approximately 0.7 V to 1.5 V, and the negative drain potential for erasing is between approximately −0.3 V to −1.0 V. In a specific embodiment, the positive gate potential for erasing is approximately 1.0 V, and the negative drain potential for erasing is approximately −1.0 V. In the embodiment of GIDL current, to write logic "0", gate terminal 120 is coupled to a negative gate potential for erasing, and drain terminal 118 is coupled to a positive drain potential for erasing. In one embodiment, the negative gate potential for erasing is between approximately −1.5 V to −3.0 V, and the positive drain potential for erasing is between approximately 0.0 V to 0.5 V. In a specific embodiment, the negative gate potential for erasing is approximately −1.8 V, and the positive drain potential for erasing is approximately 0.0 V (ground potential). In one embodiment, the use of GIDL current is limited to refresh or read-modify-write operations because the terminal potentials given above may not overwrite logic "1" with a logic "0".

In one embodiment, the gate potentials for writing logic "1" and logic "0" (i.e., for writing and erasing) are substantially the same. Because random data consisting of logic "1's" and "0's" are expected to be written, using the same gate potential avoids limiting the speed of operation due to the time required for changing the gate potential.

FIG. 1C illustrates an embodiment of the operation of reading. To read, gate terminal 120 is coupled to a positive gate potential for reading, and drain terminal 118 is connected to a positive drain potential for reading. When holes 124 are present in floating body region 108 near bias gate layer 106, a high gate current results in a logic "1" reading. When holes 124 are not present in floating body region 108 near bias gate layer 106, a low gate current results in a logic "0" reading. In one embodiment, the positive gate potential for reading is between approximately 0.5 V to 1.5 V, and the positive drain potential for reading is between approximately 0.2 V to 1.0 V. In a specific embodiment, the positive gate potential for reading is approximately 1.0 V, and the positive drain potential for reading is approximately 0.3 V.

FIG. 1D illustrates an embodiment of the operation of reading. To hold, gate terminal 120 is coupled to a negative gate potential for holding, and drain terminal 118 is coupled to a positive drain potential. When logic "1" has been written, holes 124 are confined in floating body region 108 near bias gate layer 106. In one embodiment, the negative gate potential for holding is between approximately −0.2 V to −1.0 V, and the positive drain potential for reading is between approximately 0.0 V to 0.5 V. In a specific embodiment, the negative gate potential for reading is approximately −0.5 V, and the positive drain potential for reading is approximately 0 V (the ground potential).

Figure 2:
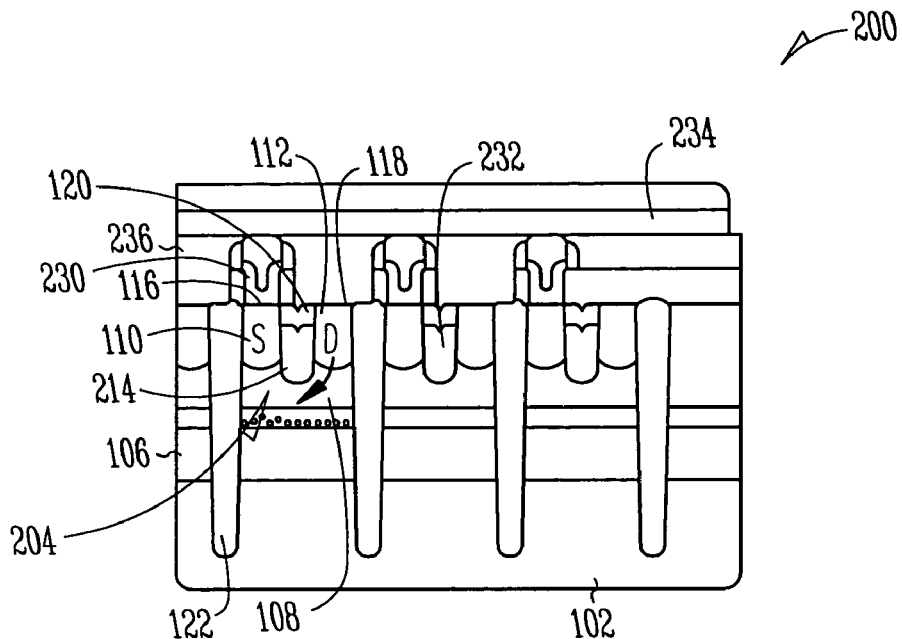
FIG. 2 is an illustration of a specific embodiment of the structure of portions of the DRAM device of FIG. 1.

FIG. 2 is an illustration of an embodiment of the structure of portions of a DRAM device 200, which represents a specific embodiment of DRAM device 100. DRAM device 200 includes 1T capacitor-less memory cells each formed with a MOS transistor 204. MOS transistor 204 is a specific embodiment of MOS transistor 104 and is implemented as a buried recessed-access device (RAD).

MOS transistor 204 is formed on base substrate 102 between oxide isolations 122. MOS transistor 204 includes bias gate layer 106 formed on base substrate 102, floating body region 108 on bias gate layer 106 between source region 110 and drain region 112, and buried gate dielectric 214 between source region 110 and drain region 112. Source terminal 116 is connected to a ground potential line 230. Gate terminal 120 is connected to a word line 232. Drain terminal 118 is connected to a bit line 234 via contact plug 236.

Figure 3:
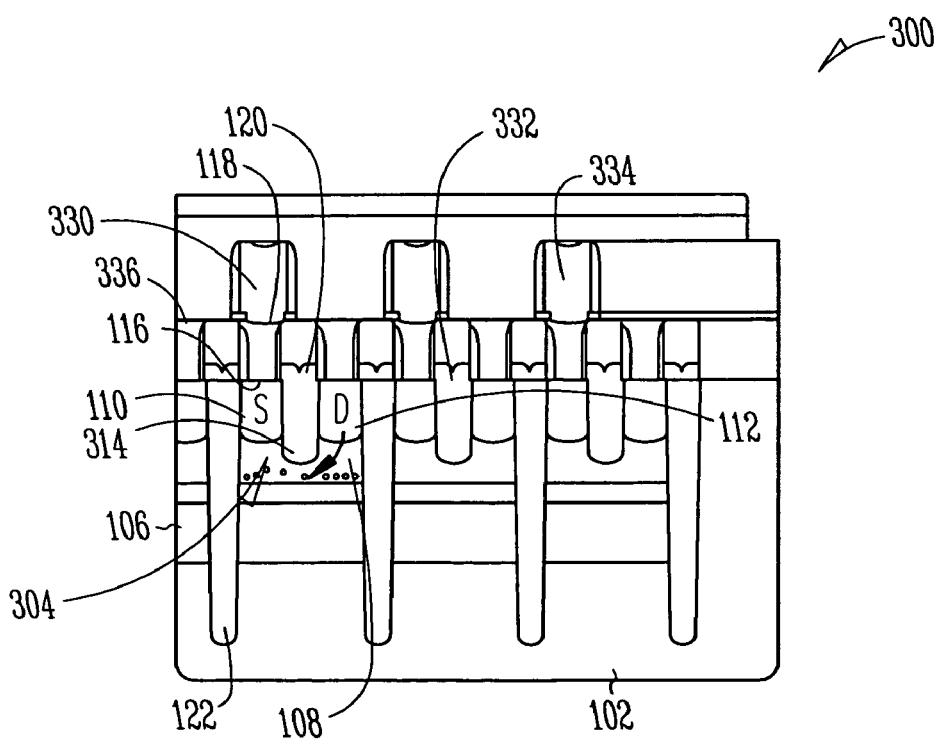
FIG. 3 is an illustration of another specific embodiment of the structure of portions of the DRAM device of FIG. 1.

FIG. 3 is an illustration of an embodiment of the structure of portions of a DRAM device 300, which represents a specific embodiment of DRAM device 100. DRAM device 300 includes 1T capacitor-less memory cells each formed with a MOS transistor 304. MOS transistor 304 is a specific embodiment of MOS transistor 104 and is implemented as a strapped RAD.

MOS transistor 304 is formed on base substrate 102 between oxide isolations 122. MOS transistor 304 includes bias gate layer 106 formed on base substrate 102, floating body region 108 on bias gate layer 106 between source region 110 and drain region 112, and buried gate dielectric 314 between source region 110 and drain region 112. Source terminal 116 is connected to a ground potential line 330 via contact plug 336. Gate terminal 118 is connected to a word line 332. Drain terminal is connected to a bit line 334.

Figure 4:
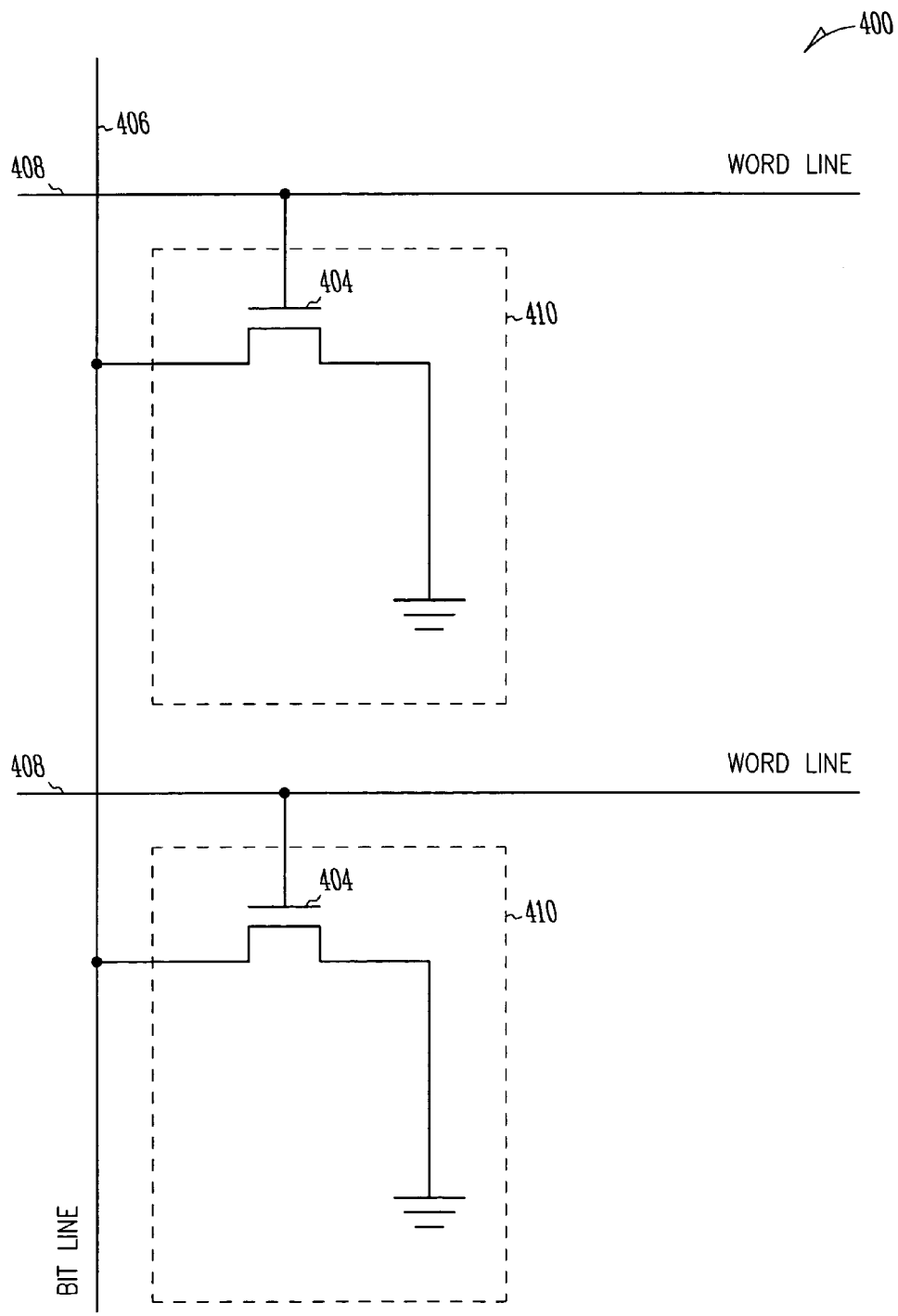
FIG. 4 is a circuit schematic illustrating DRAM cells using transistors of FIG. 1.

FIG. 4 is a circuit schematic illustrating a portion of a DRAM device 400 including DRAM cells 410. DRAM cells 410 are 1T capacitor-less memory cells each include a MOS transistor 404. In one embodiment, MOS transistor 404 is MOS transistor 104. In specific embodiments, MOS transistor 404 is MOS transistor 204 or MOS transistor 304. MOS transistor 404 has a drain terminal coupled to a bit line 406, a gate terminal coupled to a word line 408, and a source terminal coupled to a ground potential.

Figure 5:
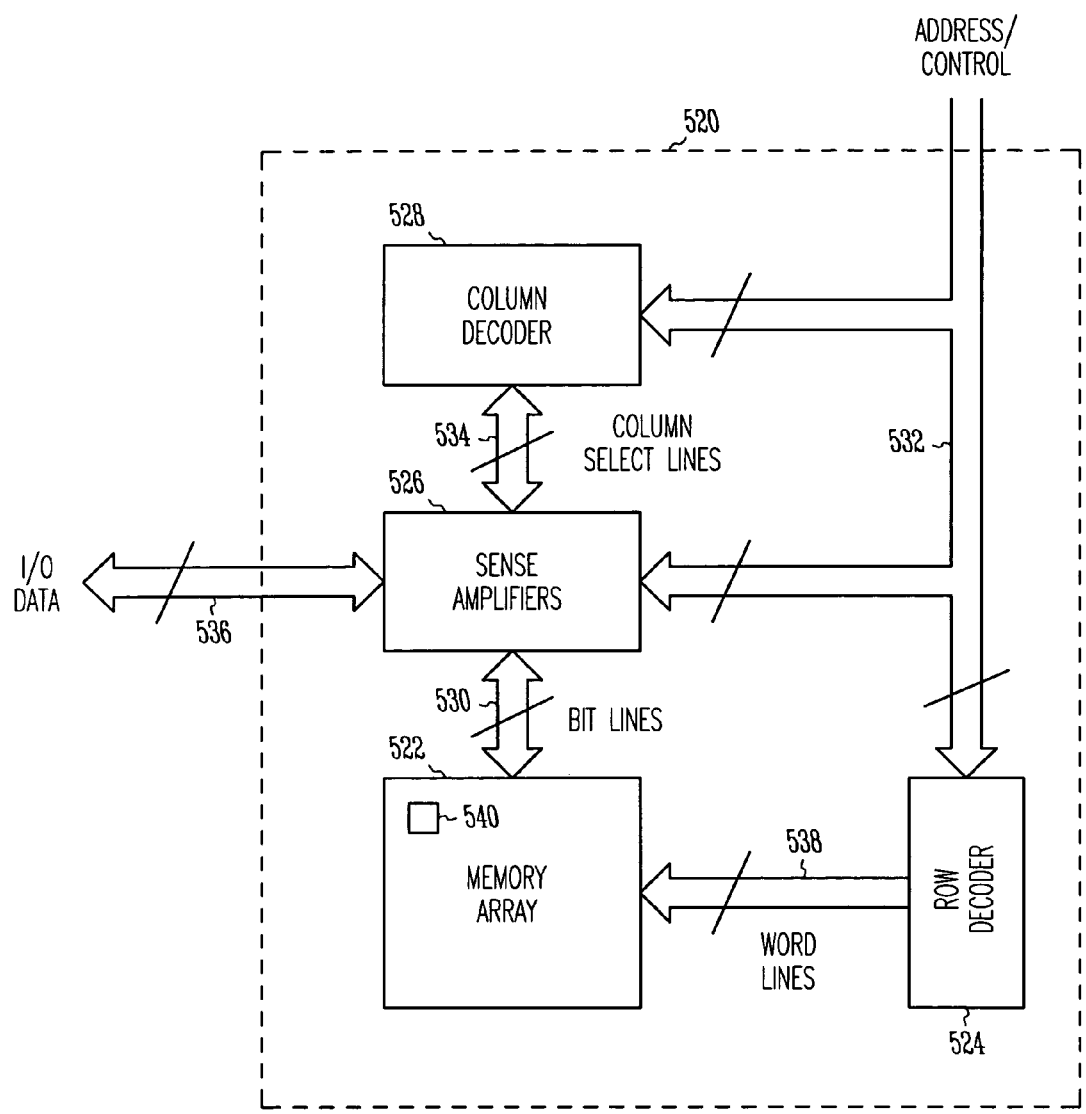
FIG. 5 is a block diagram illustrating an embodiment of a memory device utilizing the transistors of FIG. 1.

FIG. 5 is a block diagram illustrating an embodiment of a memory device 520 utilizing MOS transistor 104 (including its specific embodiments such as MOS transistors 204 or 304). Memory device 520 contains a memory array 522, a row decoder 524, a column decoder 528, and sense amplifiers 526. Memory array 522 includes a plurality of transistor cells 540 each being a 1T capacitor-less memory cell formed with a MOS transistor such as MOS transistor 104. Word lines 538 and bit lines 530 are commonly arranged into rows and columns. Bit lines 530 of memory array 522 are connected to sense amplifiers 526, while word lines 538 are connected to row decoder 524. Address and control signals are input on address/control lines 532 into memory device 520 and are connected to column decoder 528, sense amplifiers 526, and row decoder 524, and are used to gain read and write access, among other things, to memory array 522.

Column decoder 528 is connected to sense amplifiers 526 via control and column select signals on column select lines 534. Sense amplifiers 526 receives input data destined for memory array 522, and outputs data read from memory array 522 over input/output (I/O) data lines 536. Data is read from the cells of memory array 522 by activating one of the word lines 538 (via the row decoder 524), which couples all of the memory cells corresponding to that word line to respective bit lines 530, which define the columns of the array. One or more bit lines 530 are also activated. When a particular word line 538 and bit lines 530 are activated, sense amplifiers 526 connected to a bit line column detects and amplifies the conduction sensed through a given transistor cell and transferred to its bit line 530 by measuring the potential difference between the activated bit line 530 and a reference line which may be an inactive bit line. In the read operation the source region of a given cell is coupled to bit line. The operation of Memory device sense amplifiers is described, for example, in U.S. Pat. Nos. 5,627,785; 5,280,205; and 5,042,011, all assigned to Micron Technology Inc., the specification of which are incorporated by reference herein in their entirety.

Figure 6:
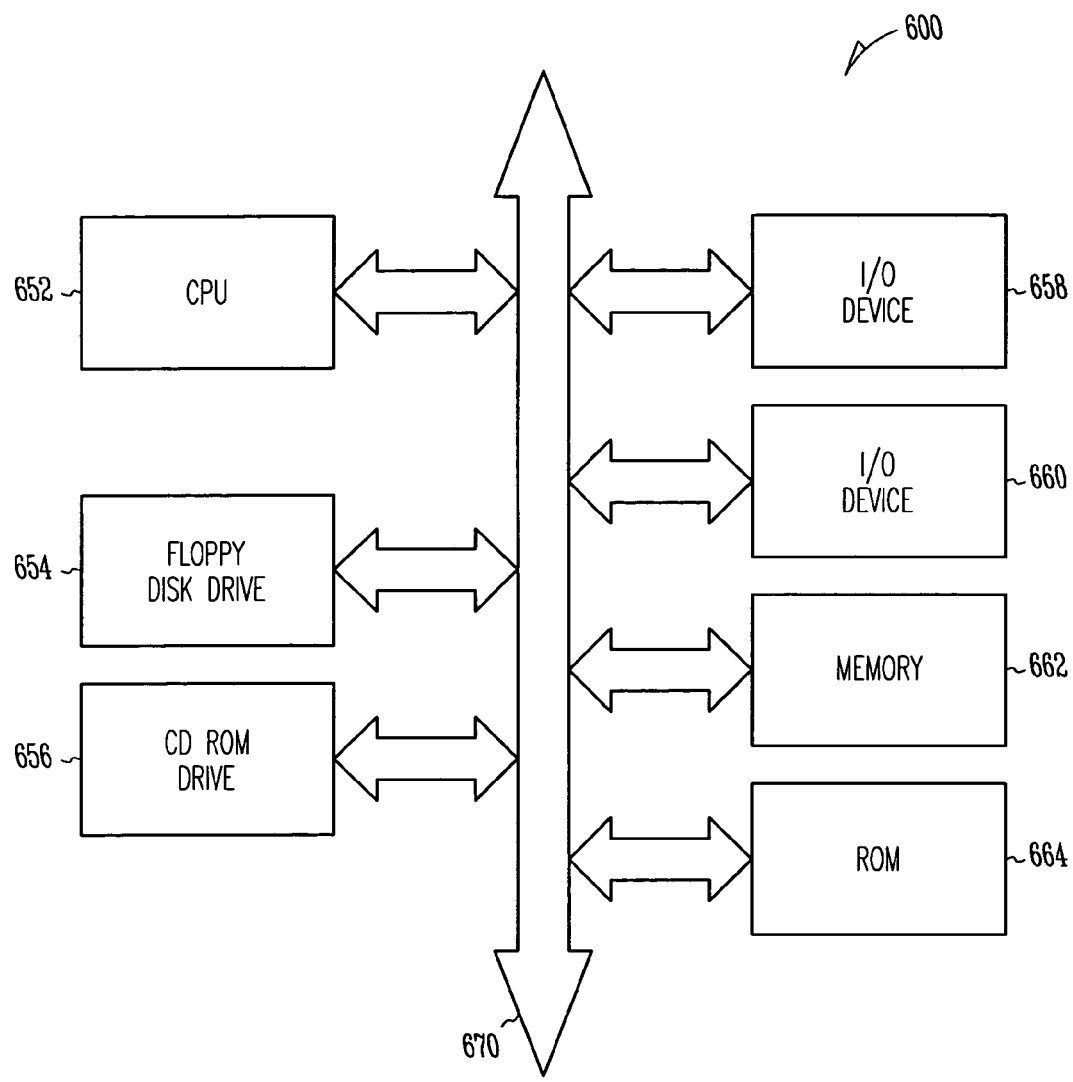
FIG. 6 is a block diagram illustrating an embodiment of a processor-based system utilizing the transistors of FIG. 1.

FIG. 6 is a block diagram illustrating an embodiment of a processor-based system utilizing MOS transistor 104 (including its specific embodiments such as MOS transistors 204 or 304). FIG. 6 is a block diagram of an electrical system, or processor-based system, 600 utilizing 1T capacitor-less memory cells each formed with a MOS transistor such as MOS transistor 104. The processor-based system 600 may be a computer system, a process control system or any other system employing a processor and associated memory. System 600 includes a central processing unit (CPU) 652, e.g., a microprocessor that communicates with the memory 662 and an I/O device 658 over a bus 690. It is noted that bus 690 may be a series of buses and bridges commonly used in a processor-based system, but for convenience purposes only, bus 690 has been illustrated as a single bus. A second I/O device 660 is illustrated, but is not necessary. The processor-based system 600 can also include read-only memory (ROM) 664 and may include peripheral devices such as a floppy disk drive 654 and a compact disk (CD) ROM drive 656 that also communicates with the CPU 652 over the bus 690 as is well known in the art.

It will be appreciated by those skilled in the art that additional circuitry and control signals can be provided, and that the processor-based system 600 has been simplified to help focus on the invention.

FIG. 6 illustrates an embodiment for electronic system circuitry in which one or more transistors including those as illustrated in FIGS. 1A-D, 2, and 3 are used. The illustration of system 600, as shown in FIG. 6, is intended to provide a general understanding of one application for the structure and circuitry of the present invention, and is not intended to serve as a complete description of all the elements and features of an electronic system using the novel 1T capacitor-less memory cells discussed in this document. Further, the invention is equally applicable to any size and type of system 600 using the one or more transistors including those as illustrated in FIGS. 1A-D, 2, and 3, and is not intended to be limited to that described above. As one of ordinary skill in the art will understand, such an electronic system can be fabricated in single-package processing units, or even on a single semiconductor chip, in order to reduce the communication time between the processor and the memory device.

Applications containing MOS transistors each having a floating body region separated from a base substrate by a conductive biased gate layer, such as MOS transistor 104 and its specific embodiments described in this document, include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

FIGS. 7-15 illustrate an embodiment of a fabrication process for a DRAM device according to the present subject matter. FIGS. 7-15 and the associated description below illustrate the process of making MOS transistors having floating body regions separated from a base substrate by a bias gate layer, such as MOS transistors 104, 204, and 304 as discussed above. While not intended to be a full description of the fabrication process, FIGS. 7-15 and the associated description below provide sufficient details to enable those skilled in the art to make 1T capacitor-less memory devices by practicing the invention.

The size of each physical structure of a memory device is described by the size of electrically conductive lines (word and bit lines) in terms of lithographic feature size (F). The lithographic feature size (F) is one half of the minimum pitch, i.e., one half of the sum of the width of one of the electrically conductive lines and the width of the isolation space between the electrically conductive lines. An $8F^2$ memory cell refers to a memory cell that has an area of 8 square lithographic features. Specific sizes discussed below with references to FIGS. 7-15 are based on a process for fabricating of $8F^2$ memory cells. However, the process illustrated in FIGS. 7-15 is generally applicable to fabricate memory cells with other cell sizes.

Figure 7A:
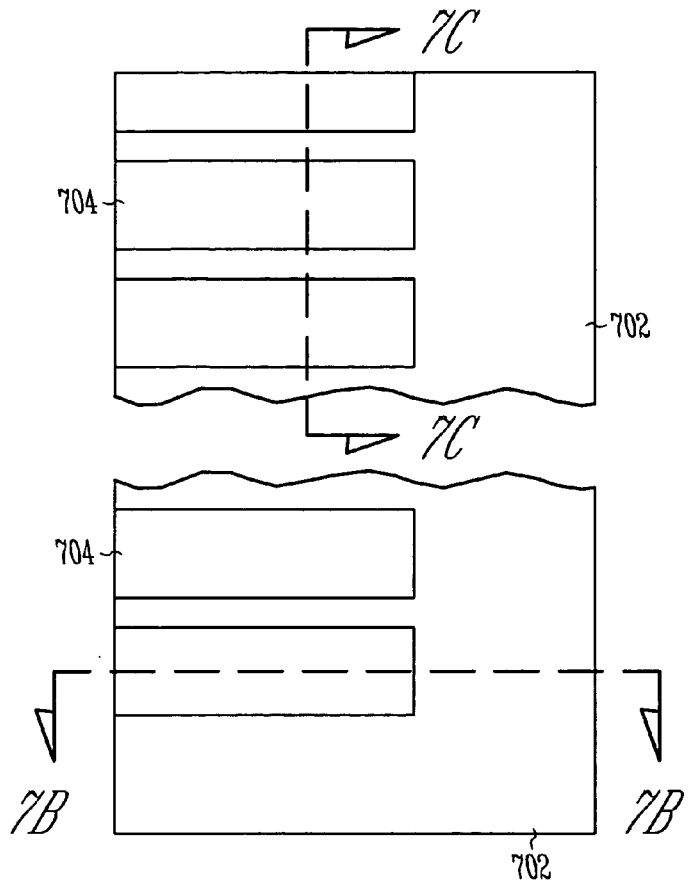
FIGS. 7A-C are illustrations of shallow-trench-isolation (STI) and active area formation in an embodiment of a fabrication process for a DRAM device.
Figure 7B:
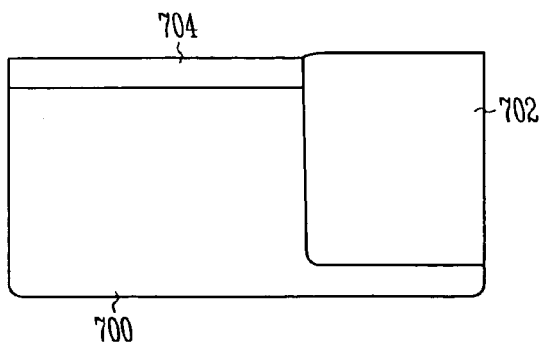
Figure 7C:
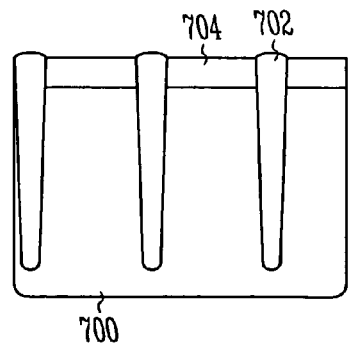

FIGS. 7A-C illustrate the formation of shallow-trench-isolations (STIs) 702 and active areas between the STIs 702. FIG. 7A is a top view of the DRAM device being fabricated, and FIGS. 7B-C are each a cross-sectional view. Shallow-trench-isolations 702 and the active areas are formed on a silicon base substrate 700. The active areas are each 3F wide. STIs 702 are each 1F wide and made of silicon oxide ($SiO_2$). The depth of each STI 702 is about 3,500 angstroms (Å). A nitride cap 704 is formed on each active area.

Figure 8A:
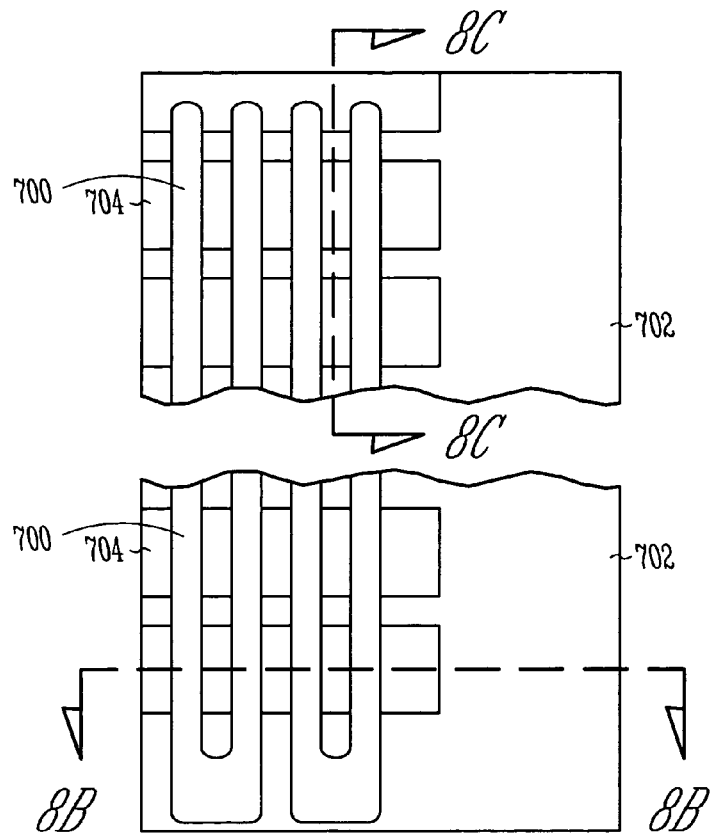
FIGS. 8A-C are illustrations of silicon (Si) island formation in the embodiment of the fabrication process.
Figures 8B, 8C:
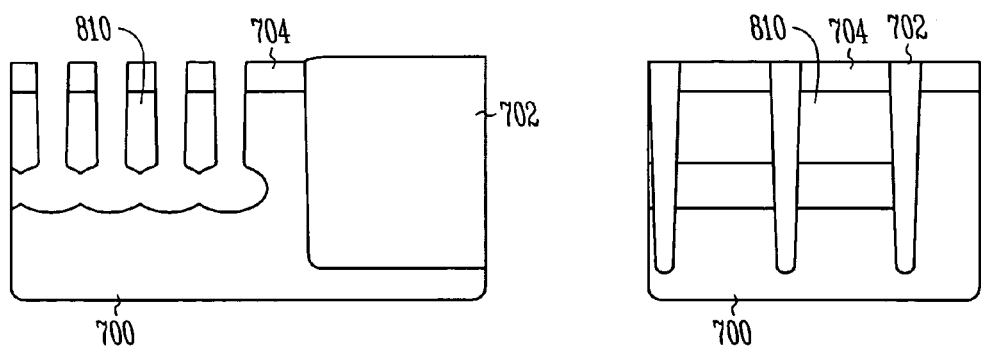

FIGS. 8A-C illustrate the formation of silicon islands 810. FIG. 8A is a top view of the DRAM device being fabricated, and FIGS. 8B-C are each a cross-sectional view. Silicon islands 810 are formed using a pattern of 1F lines separated by 1F spaces and perpendicular to the STIs 702 and the active areas. An in situ trench etch is performed to remove both STIs 702 and the active areas along the 1F lines with a depth of about 2,000angstroms. An in situ undercut etch is then performed to form the silicon islands 810 by disconnecting them from base substrate 700. Silicon islands 810 are held by STIs 702. Nitride cap 704 also helps prevent silicon islands 810 from being broken off.

Figure 9A:
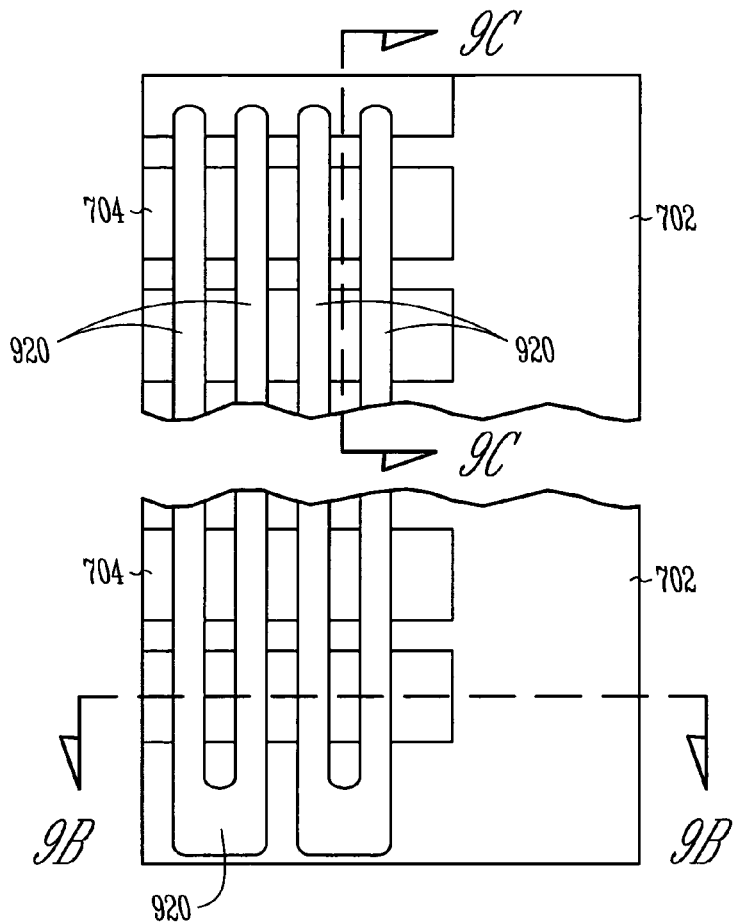
FIGS. 9A-C are illustrations of bias gate formation in the embodiment of the fabrication process.
Figure 9B:
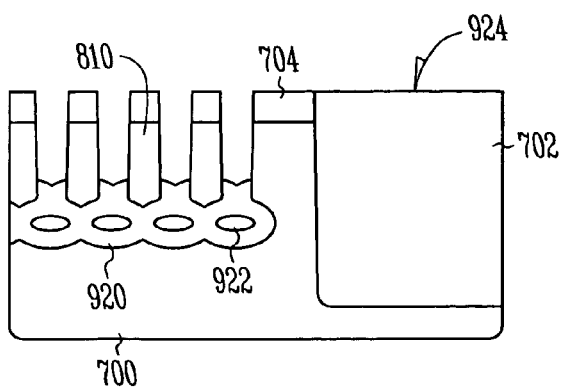
Figure 9C:
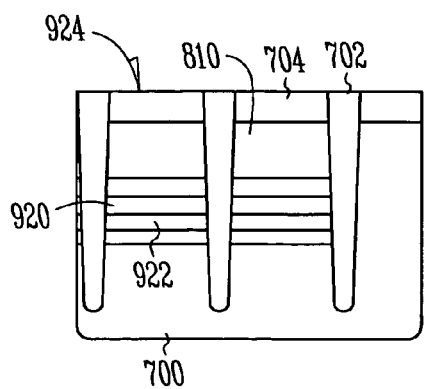

FIGS. 9A-C illustrate the formation of a conductive bias gate layer 920. FIG. 9A is a top view of the DRAM device being fabricated, and FIGS. 9B-C are each a cross-sectional view. With nitride cap 704 intact, the exposed silicon is oxidized to form gate dielectric. In situ-doped (ISD) polysilicon is deposited to fill the gaps between silicon islands 810. A combination of chemical-mechanical polishing (CMP) and reactive ion etching (RIE), or a simple RIE, is performed to recess the ISD polysilicon at about 1,500 angstroms from a surface 924, which is the top surface of the device during the fabrication process. This leaves about 500 angstroms of the ISD polysilicon on the side of silicon islands 810. At this point, conductive bias gate layer 920 is defined and self-aligned to silicon islands 810. Voids 922 may be present in the ISD polysilicon, which do not affect the function of bias gate layer 920.

Bias gate layer 920 separates silicon islands 810 from base substrate 700. The gate dielectric formed on the exposed silicon before the deposition of the ISD polysilicon insulates silicon islands 810, thus making silicon islands 810 the floating bodies of MOS transistors. That is, when the fabrication process for the DRAM device is completed, each silicon island becomes floating body region 108, and each bias gate 920 becomes bias gate layer 106, of a MOS transistor such as MOS transistor 104, 204, or 304 as discussed above.

FIGS. 10A-C illustrate planarization of surface 924. FIG. 10A is a top view of the DRAM device being fabricated, and FIGS. 10B-C are each a cross-sectional view. The exposed ISD polysilicon of bias gate layer 920 is oxidized using thin oxidation. The trenches are filled with $SiO_2$, such as by nitride liner and spin-on-dielectric (SID). A stop-on-nitride (SON) CMP is then performed. Surface 924 is thus planarized, with sacrificial nitride exposed for subsequent wet nitride removal.

Figure 11A:
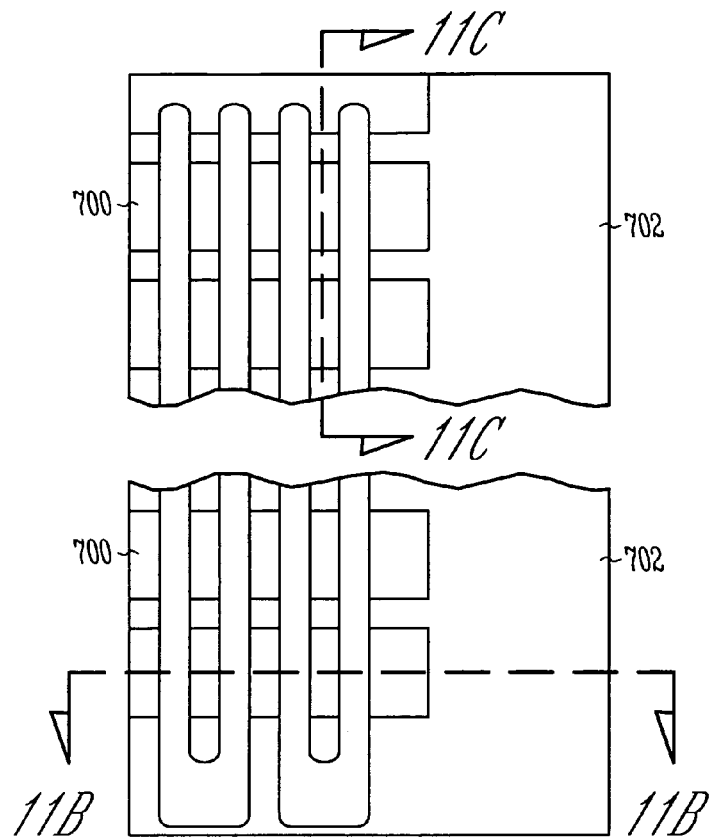
FIGS. 11A-C are illustrations of gate dielectric formation in the embodiment of the fabrication process.
Figures 11B, 11C:
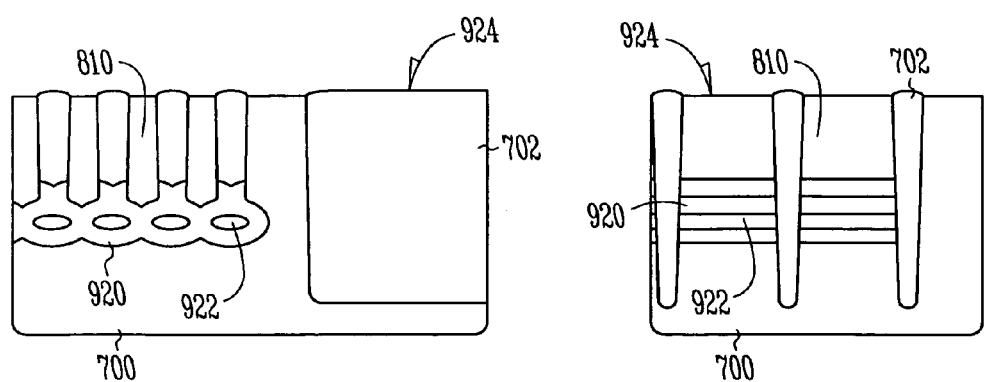

FIGS. 11A-C illustrate removal of nitride cap 704. FIG. 11A is a top view of the DRAM device being fabricated, and FIGS. 11B-C are each a cross-sectional view. The remaining portions of nitride cap 704 are removed by a hot phosphoric wet nitride removal. Thick or thin gate dielectric is formed by oxidation.

FIGS. 12A-C illustrate the formation of array recessed gates 1230. FIG. 12A is a top view of the DRAM device being fabricated, and FIGS. 12B-C are each a cross-sectional view. In one embodiment, recessed-access-device (RAD) is formed through a polysilicon process. Silicon islands 810 are recessed by trench etch to about 1,000 angstroms below surface 924. The resultant exposed silicon is oxidized to form the gate dielectric. Array and "dummy" gates are defined at the same time. Dummy (ground) gates 1232 are defined in the array over STIs 702 to isolate the subsequent polysilicon plugs. Gate nitride spacers 1234 are formed on array recessed gates 1230 and dummy gates 1232.

Figure 13A:
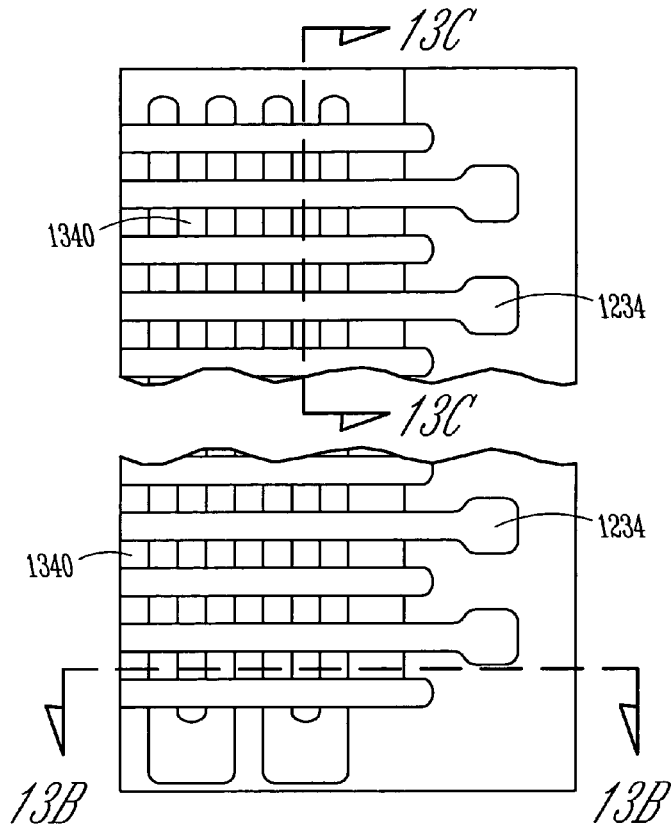
FIGS. 13A-C are illustrations of source/drain poly plug contacts formation in the embodiment of the fabrication process.
Figures 13B, 13C:
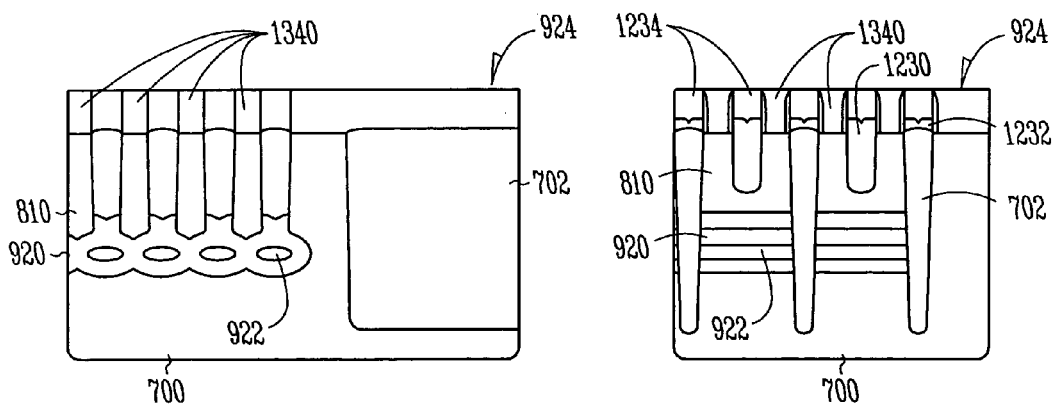

FIGS. 13A-C illustrate the formation of drain and source polysilicon plugs 1340. FIG. 13A is a top view of the DRAM device being fabricated, and FIGS. 13B-C are each a cross-sectional view. Drain and source implant may be done before or after the formation of gate nitride spacers 1234 to enhance the GIDL effects. Drain and source polysilicon plugs 1340 are formed by teos or phosphor-silicon-glass or boro-phosphor-silicon-glass deposition and reflow. A stop-on-nitride (SON) CMP follows. In one embodiment, adjacent source contacts are arranged to tie together to lower contact resistance.

FIGS. 14A-C illustrate the formation of common source interconnections 1450. FIG. 14A is a top view of the DRAM device being fabricated, and FIGS. 14B-C are each a cross-sectional view. A thin oxide is deposited on surface 924, followed by a common source contact etch to open the source contact. A common source interconnect conductor 1452 is deposited. A nitride cap 1454 is formed on the common source interconnect conductor 1452.

Figure 15A:
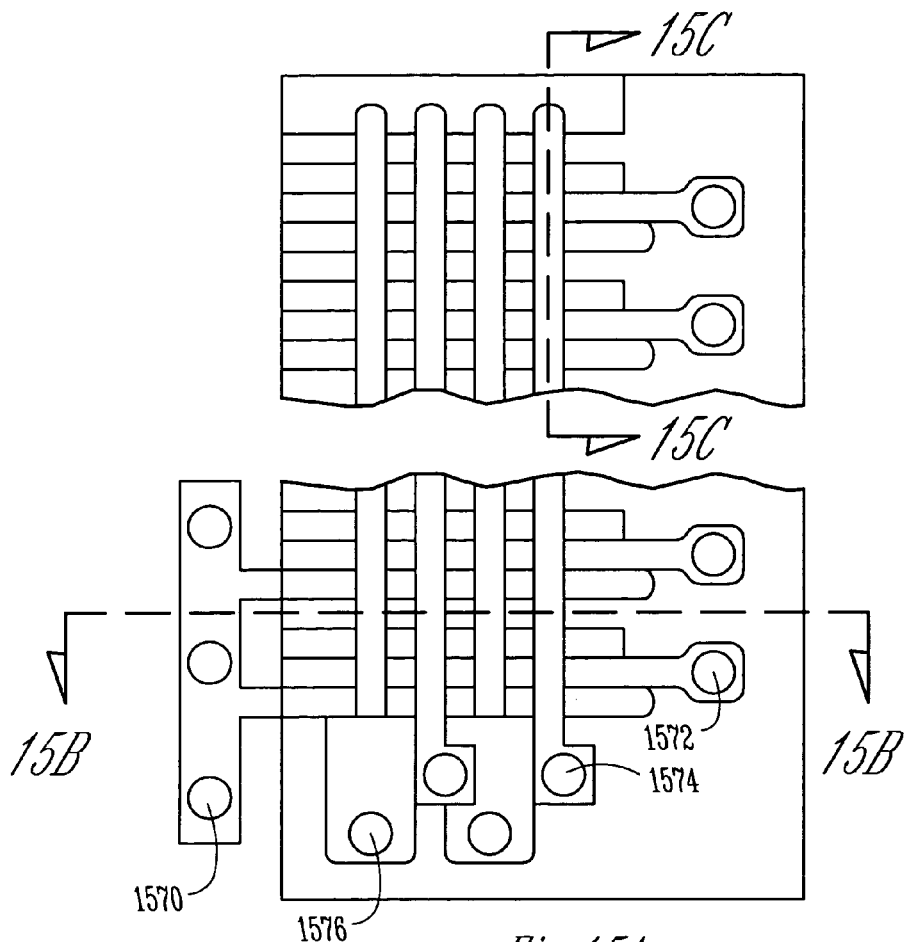
FIGS. 15A-C are illustrations of array drain and peripheral local interconnection formation in the embodiment of the fabrication process.
Figure 15B:
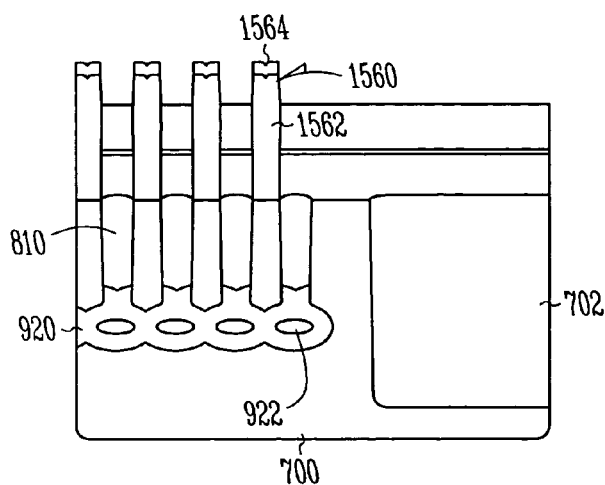
Figure 15C:
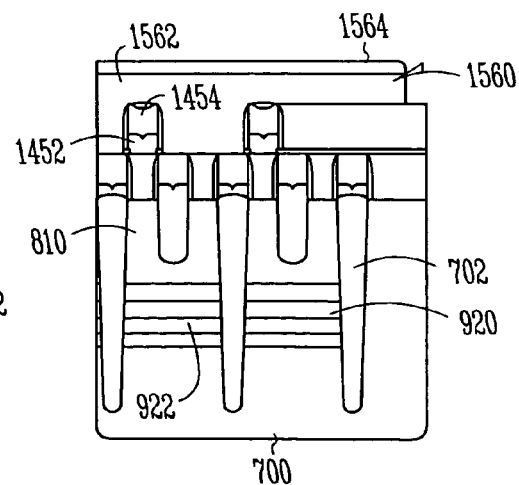

FIGS. 15A-C illustrate the formation of array drain and peripheral local interconnections. FIG. 15A is a top view of the DRAM device being fabricated, and FIGS. 15B-C are each a cross-sectional view. Drain interconnects (bit lines) 1560 are each formed with an interconnect conductor 1562, and nitride cap 1564 is deposited on the interconnect conductor 1562. Examples of the interconnect conductor include TiSix/W and metal-mode-titanium/Tungsten (MMTi/W). An example of the material forming the nitride cap is $Si_3N_4$. Array drain contacts are self-aligned-contact (SAC) etched to expose the polysilicon below. Peripheral contacts of the interconnects are exposed by etching.

The peripheral contacts illustrated in FIG. 15A include source contacts 1570, gate contacts 1572, drain contacts 1574, and bias gate contacts 1756. These contacts are each connected to a potential line that is to be coupled to a specified potential during the operation of the DRAM device. The specified potential may be constant during the operation, such as the potential coupled to the source terminal and the bias gate layer of a MOS transistor of the DRAM device, or variable during the operation, such as the potential coupled to the gate terminal and the drain terminal of the MOS transistor. An example of the potentials to which source contacts 1570, gate contacts 1572, drain contacts 1574, and bias gate contacts 1756 are coupled to during the operation of the DRAM device is given above in FIGS. 1A-D and the associated discussion. In this example, assuming the contacts provide for connections between MOS transistor 104 and the potential lines, source contact 1570 is coupled to source terminal 116, gate contact 1572 is coupled to gate terminal 120, drain contact 1574 is coupled to drain terminal 118, and bias gate contact 1756 is coupled to bias gate layer 106.

This disclosure includes several processes and structures. The present invention is not limited to a particular process order or structural arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A semiconductor device, comprising:
    a substrate comprising base single crystalline semiconductor material; and
    MOS transistors formed on the base semiconductor material, individual of the MOS transistors including:
        a conductive inner bias gate layer within the base single crystalline semiconductor material;
        a floating body region over the inner bias gate layer, the floating body region comprising the base single crystalline semiconductor material;
        a drain region coupled to the floating body region, the drain region comprising the base single crystalline semiconductor material;
        a source region coupled to the floating body region, the source region comprising the base single crystalline semiconductor material; and
        a conductive outer gate coupled to the floating body region, the outer gate being recessed from an outer surface of and into the base single crystalline semiconductor material, the outer gate being received between the drain region and the source region within the base single crystalline semiconductor material.

2. The device of claim 1, wherein the conductive bias gate layer comprises polysilicon.

3. The device of claim 1, wherein the MOS transistors are each surrounded by isolation oxide.

4. The device of claim 1, wherein the source region is coupled to a ground potential line, and the conductive bias gate layer is coupled to a potential line that is to be coupled to a negative potential during operation of the semiconductor device.

5. The device of claim 1 wherein the outer gate is received above and below said outer surface.

6. The device of claim 1 wherein the outer gate extends into the base single crystalline semiconductor material deeper than do each of the source region and the drain region.

7. The device of claim 1 comprising trench isolation within the base single crystalline semiconductor material, the source region and the drain region having a respective side which contacts the trench isolation.

8. The device of claim 1 comprising a gate dielectric in contact with the outer gate, the source region and the drain region having a respective side which contacts the gate dielectric.

9. The device of claim 1 comprising trench isolation within the base single crystalline semiconductor material and a gate dielectric in contact with the outer gate, the source region and the drain region having a respective first side which contacts the trench isolation, the source region and the drain region having a respective second side which contacts the gate dielectric.

10. The device of claim 9 wherein the outer gate extends into the base single crystalline semiconductor material deeper than do each of the source region and the drain region.

11. The device of claim 1 comprising a gate dielectric in contact with the inner bias gate, the source region and the drain region having a respective innermost base which is spaced above the gate dielectric.

12. The device of claim 1 wherein the inner bias gate comprises a void therein.

13. The device of claim 12 comprising trench isolation regions within the base single crystalline semiconductor material, the void extending from one of the trench isolation regions to another of the trench isolation regions.

14. The device of claim 1 wherein the inner bias gate is associated with a plurality of the MOS transistors, the inner bias gate comprising multiple voids therein.

15. The device of claim 1 comprising a memory device including word lines and bit lines, individual of the drain regions being coupled to one of the bit lines, individual of the source regions being coupled to one of the word lines.

16. A semiconductor device, comprising:
    a substrate; and
    MOS transistors formed on the substrate, individual of the MOS transistors including:
        a conductive inner bias gate layer;
        a floating body region over the inner bias gate layer, the floating body region being formed in a region of semiconductor material;
        a drain region coupled to the floating body region, the drain region being formed in the region of semiconductor material;
        a source region coupled to the floating body region, the source region being formed in the region of semiconductor material; and
        a conductive outer gate coupled to the floating body region, the outer gate being recessed from an outer surface of and into the region of semiconductor material, the outer gate being received between the drain region and the source region within the region of semiconductor material.

17. The device of claim 16 wherein the outer gate is received above and below an outer surface of said region of semiconductor material.

18. The device of claim 16 wherein the outer gate extends into said region of semiconductor material deeper than do each of the source region and the drain region.

19. The device of claim 16 comprising a gate dielectric in contact with the inner bias gate, the source region and the drain region having a respective innermost base which is spaced above the gate dielectric.

20. The device of claim 16 wherein the inner bias gate comprises a void therein.

21. The device of claim 20 wherein the substrate comprises trench isolation regions, the void extending from one of the trench isolation regions to another of the trench isolation regions.

22. The device of claim 16 wherein the inner bias gate is associated with a plurality of the MOS transistors, the inner bias gate comprising multiple voids therein.

23. The device of claim 16 comprising a memory device including word lines and bit lines, individual of the drain regions being coupled to one of the bit lines, individual of the source regions being coupled to one of the word lines.

24. The device of claim 16 wherein the region of semiconductor material comprises silicon.

25. The device of claim 16 wherein the region of semiconductor material comprises single crystalline silicon.

26. A semiconductor device, comprising:
   a substrate; and
   MOS transistors formed on the substrate, individual of the MOS transistors including:
      a conductive inner bias gate layer;
      a floating body region over the inner bias gate layer;
      a drain region coupled to the floating body region;
      a source region coupled to the floating body region;
      a conductive outer gate coupled to the floating body region and between the source region and the drain region; and
      a gate dielectric in contact with the outer gate, the source region and the drain region having a respective side which contacts the gate dielectric.

27. The device of claim 26 wherein the substrate comprises trench isolation, the source region and the drain region having a respective another side which contacts the trench isolation.

28. The device of claim 26 comprising a memory device including word lines and bit lines, individual of the drain regions being coupled to one of the bit lines, individual of the source regions being coupled to one of the word lines.

29. A semiconductor device, comprising:
   a substrate; and
   MOS transistors formed on the substrate, individual of the MOS transistors including:
      a conductive inner bias gate layer comprising a void therein;
      a floating body region over the inner bias gate layer;
      a drain region coupled to the floating body region;
      a source region coupled to the floating body region; and
      a conductive outer gate coupled to the floating body region and between the source region and the drain region.

30. The device of claim 29 wherein the substrate comprises trench isolation regions, the void extending from one of the trench isolation regions to another of the trench isolation regions.

31. The device of claim 29 wherein the inner bias gate is associated with a plurality of the MOS transistors, the inner bias gate comprising multiple voids therein.

32. The device of claim 29 comprising a memory device including word lines and bit lines, individual of the drain regions being coupled to one of the bit lines, individual of the source regions being coupled to one of the word lines.

* * * * *